US008924185B2

(12) United States Patent
Moreau et al.

(10) Patent No.: US 8,924,185 B2
(45) Date of Patent: Dec. 30, 2014

(54) DESIGNING A NAVIGATION SCENE

(75) Inventors: Muriel Moreau, Viroflay (FR); Adrien Cazaban, Saclay (FR)

(73) Assignee: Dassault Systemes, Velizy Villacoublay (FR)

( * ) Notice: Subject to any disclaimer, the term of this patent is extended or adjusted under 35 U.S.C. 154(b) by 434 days.

(21) Appl. No.: 13/365,887

(22) Filed: Feb. 3, 2012

(65) Prior Publication Data

US 2012/0209574 A1 Aug. 16, 2012

(30) Foreign Application Priority Data

Feb. 15, 2011 (EP) ..................................... 11305158

(51) Int. Cl.
*G06F 17/50* (2006.01)
*G06F 3/0482* (2013.01)
(52) U.S. Cl.
CPC .............. *G06F 17/50* (2013.01); *G06F 3/0482* (2013.01)
USPC .......................................................... 703/1
(58) Field of Classification Search
CPC .................................................. G06F 17/5004
USPC .............................................. 703/1; 715/810
See application file for complete search history.

(56) References Cited

U.S. PATENT DOCUMENTS

| | | | |
|---|---|---|---|
| 2004/0153296 A1* | 8/2004 | Landers et al. ................... | 703/2 |
| 2004/0254016 A1 | 12/2004 | Shimazaki | |
| 2007/0155501 A1 | 7/2007 | Kanemori et al. | |
| 2007/0159480 A1* | 7/2007 | Delarue et al. ................ | 345/427 |
| 2009/0017909 A1 | 1/2009 | Yamada | |
| 2009/0083662 A1* | 3/2009 | Fitzmaurice et al. ......... | 715/810 |
| 2010/0255905 A1 | 10/2010 | Yuan | |

OTHER PUBLICATIONS

European Search Report of EP Application No. 11 30 5158, search dated Jul. 18, 2011, 8 pages.
3DVIA scenes—Revolutionizing the design process. [accessed on Feb. 3, 2012] Accessed from the Internet URL: http://www.3dvia.com/products/3dvia-scenes/.
TVnima—Create Amazing 3D Shows and Become the TV Director. [accessed on Feb. 3, 2012] Accessed from the Internet URL: http://www.tvnima.com.
3DVIA Shopper—Overview—Dassault Systèmes. [accessed on Feb. 3, 2012] Accessed from the Internet URL: http://3ds.com/products/3dvia/portfolio/shopper/overview.

(Continued)

*Primary Examiner* — Dwin M Craig
(74) *Attorney, Agent, or Firm* — Hamilton, Brook, Smith & Reynolds, P.C.

(57) ABSTRACT

A computer implemented method for designing a scene suitable for navigation, may comprise: positioning a plurality of objects of a respective type in the scene, wherein the objects are CAD three-dimensional modeled objects of at least two types; providing a database comprising for each type of object, at least one action, at least one triggering interface for launching the action, a function for computing at least one triggering zone, the function taking as arguments values of parameters of the objects in the scene, wherein reaching the triggering zone during navigation activates the triggering interface; and, for each respective object, instantiating triggering interfaces corresponding to the type of the respective object, and computing triggering zones by applying the function corresponding to the respective object, and adding to the scene the instantiated triggering interfaces and the computed triggering zones. Such a method provides a navigation solution in the field of CAD objects.

11 Claims, 8 Drawing Sheets

(56) References Cited

OTHER PUBLICATIONS

Engeli, Maia, et al. "A Virtual Reality Design Environment with Intelligent Objects and Autonomous Agents", *Design and Decision Support Systems*, Conference Proceedings, Spa Belgium (1996).

Autodesk Revit Architecture—Building Design Software. [accessed on Feb. 3, 2012] Accessed from the Internet URL: http://usa.autodesk.com/revit-archicture/.

3D Home Design by Livecad: Official Website. [accessed on Feb. 3, 2012] Accessed from the Internet URL: http://livecad.net/EN/.

CATIA V6—Dassault Systèmes. [accessed on Feb. 3, 2012] Accessed from the Internet URL: http://www.3ds.com/products/catia/portfolio/catia-version-6/overview/.

CATIA V5R21 drives higher Design excellence. [accessed on Feb. 3, 2012] Accessed from the Internet URL: http://www.3ds.com/products/catia/portfolio/catia-v5/catia-v5r21/.

3dsMax—3D Modeling, Animation, and Rendering Software—Autodesk. [accessed on Feb. 3, 2012] Accessed from the Internet URL: http://usa.autodesk.com/3ds-max/.

3DVIA Studio: A Powerful 3D Development Tool. [accessed on Feb. 3, 2012] Accessed from the Internet URL: http://www.3dvia.com/studio/.

iCreate3D.com—3D Architectural Animation & CGI. [accessed on Feb. 3, 2012] Accessed from the Internet URL: http://www.icreate3d.com.

DELMIA V5R21—Expanding Digital Manufacturing and shop floor solutions through the power of DS PLM and the strength of partnerships. [accessed Feb. 3, 2012] Accessed from the Internet URL: http://www.3ds.com/products/delmia/portfolio/delmia-v5r21.

DELMIA V6—A collaborative innovation and production experience for all actors in the manufacturing lifecycle. [accessed Feb. 3, 2013] Accessed from the Internet URL: http://www.3ds.com/products/delmia/portfolio/delmia-v6/overview/.

\* cited by examiner

DESIGNING A NAVIGATION SCENE

RELATED APPLICATION(S)

This application claims priority under 35 U.S.C §119 or 365 to European Application No. 11305158.5, filed Feb. 15, 2011.

The entire teachings of the above application(s) are incorporated herein by reference.

FIELD OF THE INVENTION

The invention relates to the field of computer programs and systems, and more specifically to a method, system and program for designing a scene suitable for navigation, and for navigating in such a scene.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Also known are navigation solutions which allow a user to navigate in a virtual world. Such navigation solutions include video games and life-like experience solutions. A life-like experience is a digital experience so close to reality that it can involve direct customer decision. In such an experience the user is immersed in a universe where the virtual environment looks and behaves like reality.

Within this context, there is still a need for an improved navigation solution in the field of CAD.

SUMMARY OF THE INVENTION

According to one aspect, the invention therefore provides a computer-implemented method for designing a scene suitable for navigation, wherein the method comprises the steps of: positioning a plurality of objects of a respective type in the scene, wherein the objects are CAD three-dimensional modeled objects of at least two types; providing a database comprising for each type of object at least one action, at least one triggering interface for launching the action, a function for computing at least one triggering zone, the function taking as arguments values of parameters of the objects in the scene, wherein reaching the triggering zone during navigation activates the triggering interface; for each respective object, instantiating triggering interfaces corresponding to the type of the respective object, and computing triggering zones by applying the function corresponding to the respective object, adding to the scene the instantiated triggering interfaces and the computed triggering zones.

The method may comprise one or more of the following:
  the action of a first type is different from the action of a second type;
  the objects are defined by data suitable for the manufacturing of corresponding physical objects;
  the objects are defined by data comprising any or a combination of dimension values, tolerance values, a history of geometrical features, and/or a set of behaviorizing features;
  activating the triggering interface consists in displaying a widget tool or modifying the state of a part of the object for graphical interaction with a user;
  the action is any or a combination of the following: displaying a point of interest, displaying and following a navigation path, displaying information on the object, reaching or displaying a path to the triggering zone of a sub-object, executing an intrinsic behaviour of the object, and/or displaying information or parameters of an intrinsic behaviour; and/or
  prior to positioning the plurality of objects, designing a model including the objects with a CAD system, positioning the plurality of objects, providing the database, instantiating and adding to the scene the triggering interfaces, computing and adding to the scene the triggering zones being all performed with the same CAD system.

The invention further proposes a method for navigating in a scene designed according to the above method. The navigation mode may be a 1st person navigation, a 3rd person navigation or a free camera navigation.

The invention further proposes a CAD system comprising:
  a memory storing a database comprising types of objects, wherein the objects are CAD three-dimensional modeled objects of at least two types, a plurality of objects of a respective type, for each type of object, at least one action, at least one triggering interface for launching the action, a function for computing at least one triggering zone, the function taking as arguments values of parameters of the objects in the scene, wherein reaching the triggering zone during navigation activates the triggering interface,
  a graphical user interface coupled with the memory and a processor and suitable for performing any of the above methods.

The invention further proposes a computer program comprising instructions for execution by a computer, the instructions comprising means for performing any of the above methods with a graphical user interface of a CAD system coupled with a memory and a processor, wherein the memory stores a database comprising types of objects, wherein the objects are CAD three-dimensional modeled objects of at least two types, a plurality of objects of a respective type, for each type of object at least one action, at least one triggering interface for launching the action, a function for computing at least one triggering zone, the function taking as arguments values of parameters of the objects in the scene, wherein reaching the triggering zone during navigation activates the triggering interface.

The invention further proposes a computer readable storage medium having recorded thereon a computer program according to the above.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
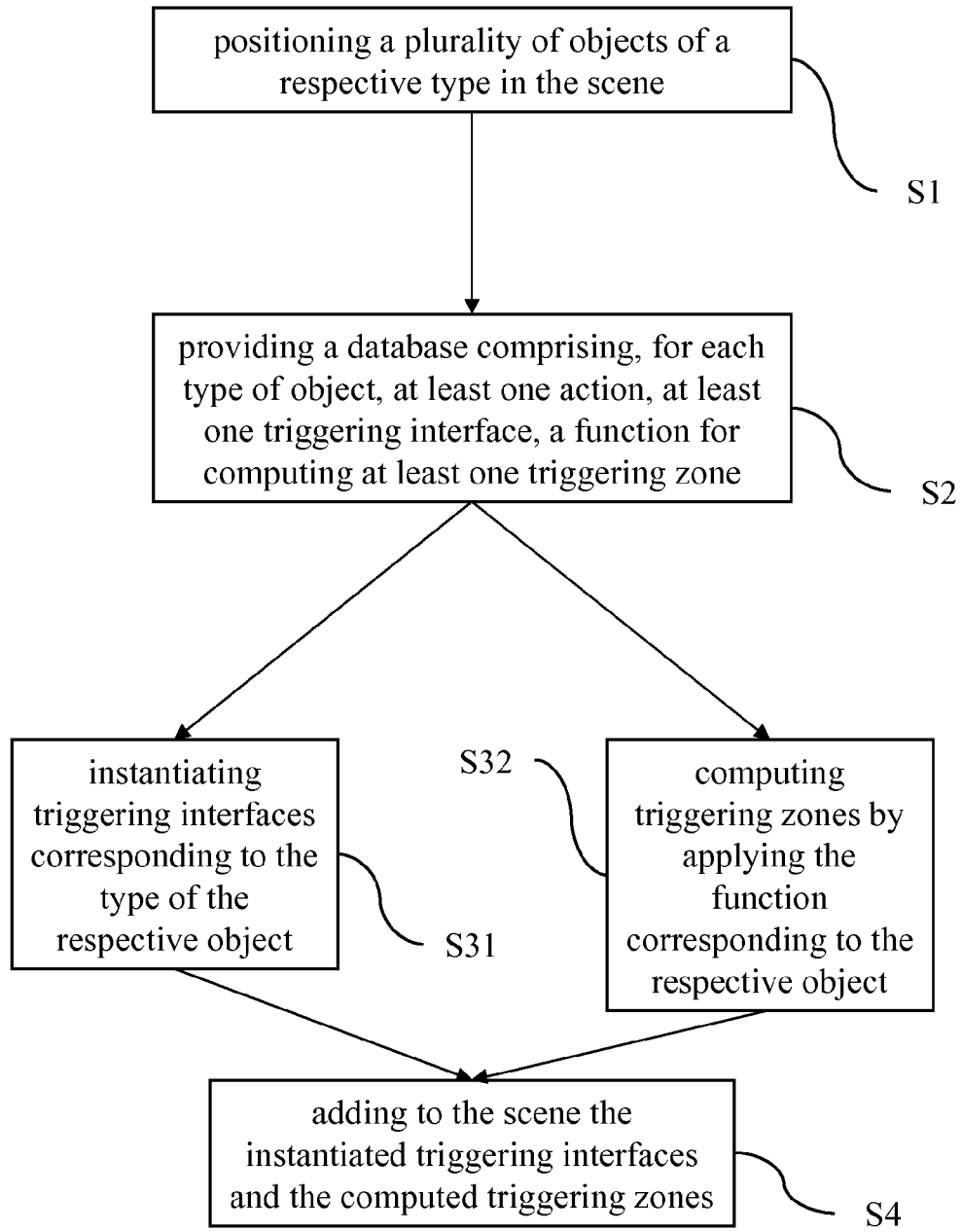
FIG. 1 shows a flowchart of an example of the method.

With reference to the flowchart of FIG. 1, it is proposed a method for designing a scene suitable for navigation. The method comprises positioning (S1) a plurality of objects of a respective type in the scene. The objects are CAD three-dimensional ("3D" hereafter) modeled objects of at least two types. The method also comprises providing (S2) a database. The database comprises, for each type of object, at least one action, at least one triggering interface for launching the action, a function for computing at least one triggering zone. The function takes as arguments values of parameters of the objects in the scene. Reaching the triggering zone during navigation activates the triggering interface. The method further comprises, for each respective object, instantiating (S31) triggering interfaces corresponding to the type of the respective object, and computing (S32) triggering zones by applying the function corresponding to the respective object; and adding (S4) to the scene the instantiated triggering interfaces and the computed triggering zones. Such a method allows the design of a scene suitable for navigation out of CAD modeled objects.

The method is computer-implemented. This means that the steps (or substantially all the steps) of the method are executed by at least one computer. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

For instance, the step of positioning (S1) is preferably triggered by the user (but is in fine performed by the computer), who is thus the architect of the scene. The step of positioning may also be a combination of an action of the computer, such as default positioning after user selection of a modeled object to add to the scene, and then user-moving of the modeled object at another position in the scene. The steps of providing (S2), instantiating (S31), computing (S32) and adding (S4) are preferably performed by the computer for higher automation and thus faster execution. The step of providing (S2) may also involve the user, e.g. who selects the database to be provided.

A typical example of computer-implementation of the method is to perform the method with a system comprising a graphical user interface (GUI) suitable for this purpose. The GUI is coupled with a memory and a processor. The memory, which stores a database, is merely any hardware suitable for such storage. Such a system is a tool which allows the design of a scene suitable for navigation out of CAD modeled objects. For example, the steps which involve the user are performed through the GUI, while the fully computerized steps are performed by the processor accessing the database, without involvement of the GUI.

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The database comprises: the types of objects; the plurality of objects of a respective type; for each type of object the at least one action, the at least one triggering interface for launching the action, the function for computing at least one triggering zone.

The method and system generally manipulate modeled objects. A modeled object is any object defined by data stored in the database. By extension, the expression "modeled object" designates the data itself. According to the type of the system, the modeled objects may be defined by different kinds of data. The system may indeed be a CAD system. The system may also be a CAD system which is also a CAE system. In those different systems, modeled objects are defined by corresponding data. One may accordingly speak of CAD object, CAE object, CAD data, CAE data. However, these systems are not exclusive one of the other, as a modeled object may be defined by data corresponding to any combination of these systems. A CAE system may thus well also be a CAD system, as will be apparent from the definitions of such systems provided below.

By CAD system, it is meant any system suitable at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file may contain specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object. By "3D modeled object", it is meant any CAD object which is modeled by data allowing its 3D representation. A 3D representation allows the viewing of the object from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The CAD system may be history-based. In this case, a CAD modeled object is further defined by data comprising a history of geometrical features. A CAD modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). This means that the creation history of design features is typically saved through an acyclic data flow linking the said geometrical features together through input and output links. A CAD modeled object is described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

The objects may be further defined by data suitable for the manufacturing of corresponding physical objects. A corresponding physical object is an industrial product of which the CAD modeled object is a representation. These data are typically a function of the manufacturing process. These may typically be dimension values and/or tolerance values. For a correct manufacturing of an object, it is indeed better to have such values.

By CAE system, it is meant any system suitable for the analysis of the physical behavior of a modeled object. In a CAE system, a modeled object is thus defined by data suitable for the analysis of such behavior. This may be typically a set of behaviouring features. For instance, a modeled object corresponding to a door may be defined by data indicating that the door rotates around an axis.

Figure 2:
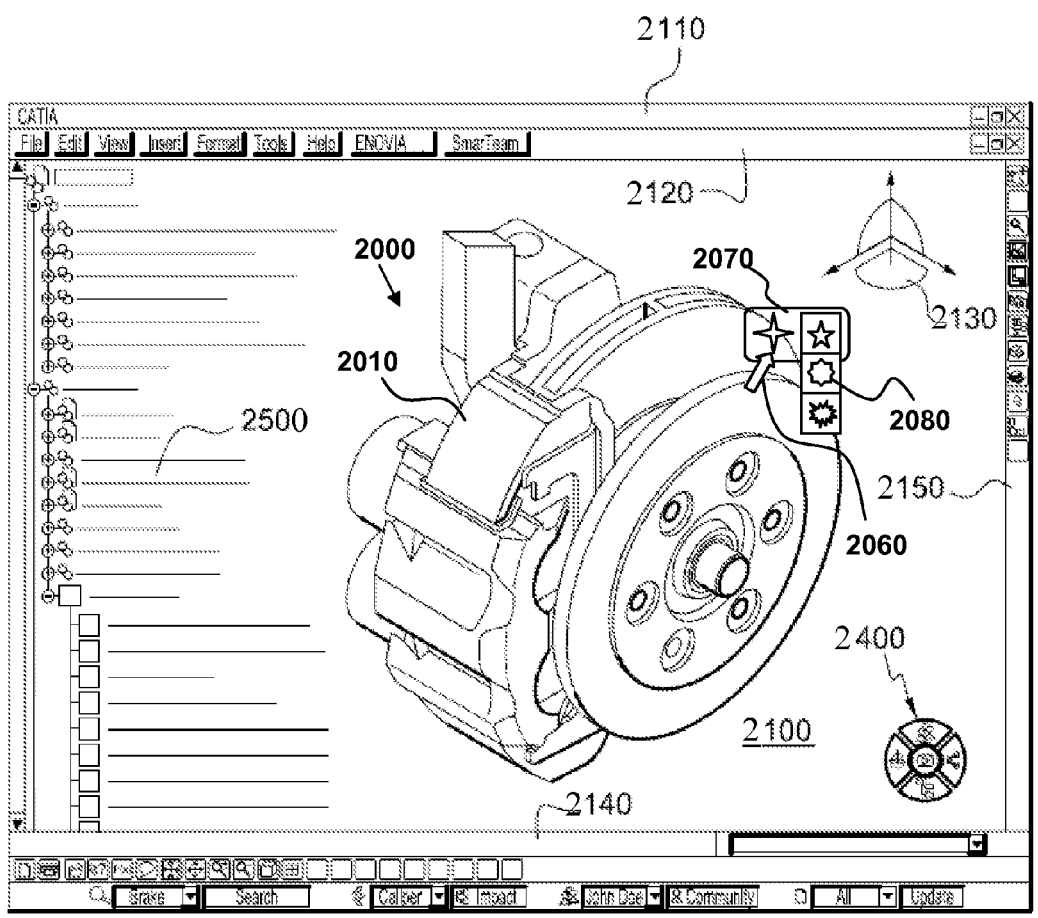
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080, 2400 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
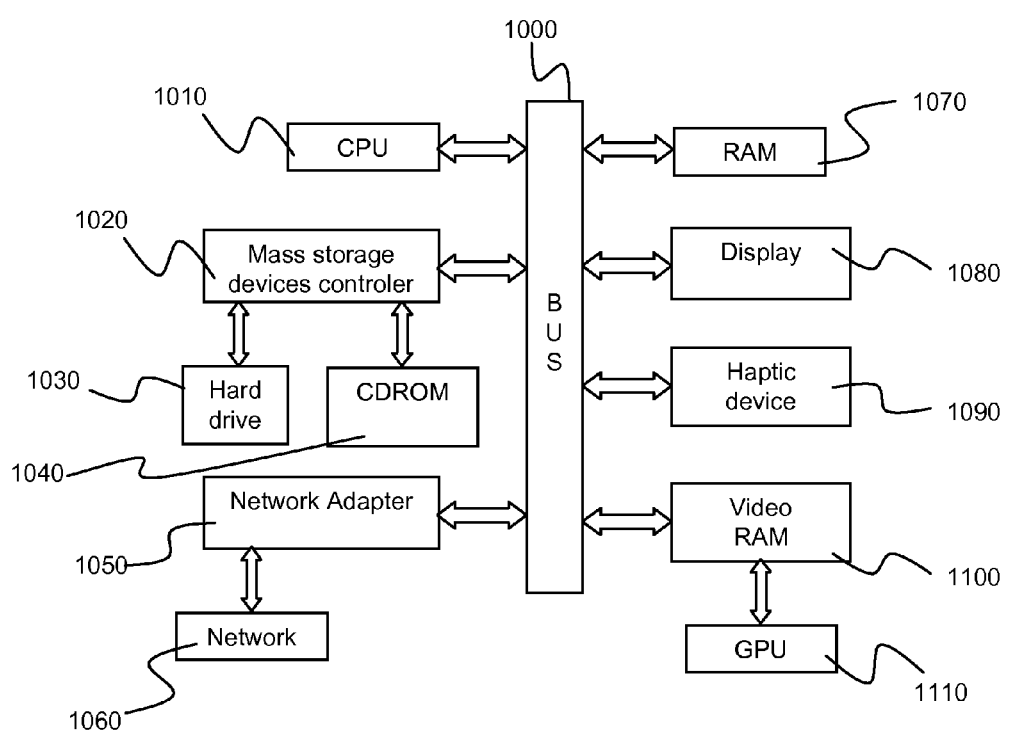
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080, as mentioned with reference to FIG. 2. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the above method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

By "scene", it is meant any area of the screen suitable for navigation. "Navigation" designates a life-like experience. Navigating may consist in moving in a virtual world comprising modeled objects. The method is for designing such an area. Typically, a user has at his disposal modeled objects which are CAD 3D objects, of at least two (different) types.

A type of an object may be an attribute of an object arbitrarily defined. For example, an object may be of the type "door", of the type "stairs", and so on. Typically, the user positions (S1) the objects in the scene, according to the experience he wishes to create. The method provides (S2) the database wherein data are arranged according to the types. Thus, the types are materialized as attributes in the database. Also, the database may provide means for determining the type of any object in case the data defining the object does not specify the type.

The database then comprises for each type of object at least one action, at least one triggering interface and a function. The objects may in this case be called "experience" objects. In the following, when no precision is provided, it is meant by "object" an "experience object", i.e. an object for which type at least one action is provided, as opposed to classical non-experience objects. The method is for designing a scene where, during navigation, events can take place in order to increase the experience of reality. Actions are such events. Actions are events associated to the objects according to their type. Each experience object may comprise one or more actions.

These actions may be associated to the triggering zones, which are themselves associated to the triggering interfaces of the object. A triggering zone is thus a space (or volume) of the scene where the action is launchable (when a position, e.g. the position of an avatar, is defined as being inside the triggering zone), through the corresponding triggering interface(s). A triggering interface is a graphical tool for launching the action. In fact, during navigation, when the user reaches a triggering zone of an object, the corresponding triggering interface(s) is(are) activated (i.e. put in a state where user-interaction is possible). The user may then interact with the triggering interfaces, e.g. through a haptic device, and thereby launch the action. Activating the triggering interfaces only when in the corresponding triggering zone makes the navigation lighter in terms of buffer used and possibly elements displayed (as a triggering interface may be an additional element to be displayed) and thus easier.

The function is a function which computes the triggering zone (i.e. calculates the volume defining the triggering zone). The function takes as arguments values of parameters of the objects in the scene. In other words, the function is stored as a procedure to compute a triggering zone of an object according to objects (the same object and/or other objects) of the scene. The function may also take as argument values of parameters of non-experience objects in the scene. Indeed, non-experience objects may also be positioned in the scene. Notably, a structure (i.e. a set of non-experience objects reproducing a place of reality, e.g. a building, a house, a mall, etc. . . . ) may be created concomitant to or prior to the step of positioning S1. This enhances the method, for a more realistic experience.

An example is to apply the method for designing a house. In this case, non-experience objects such as the walls and the roof are positioned. They form the structure. Then, experience objects such as a door and a window are positioned in the scene. The door is of the "door" type. The window is of the "window" type. Typically, a window or a door may be opened or closed. Thus, for both the "window" and "door" types, the database comprises the actions "open" and "close". The door may have another action, which is the "lock" action. The triggering interface of the action "open" may be in both cases the visible face of the door or the window. The triggering zone may be the room inside the house where the window or the door is. Thus, during navigation, when inside the room, e.g. clicking on the door or on the window may open it. The function for computing this triggering zone (e.g. for the door) may take as arguments values of parameters of (experience) objects of the scene (such as the door itself) and values of parameters of non-experience objects of the scene (such as the positions of the walls and the ceiling, all linked to the position of the door as they are in the same room). For the door, a second triggering zone may also be computed as a volume at the front of the house. Indeed, a door may be opened from the outside (whereas a window may only be opened from the inside).

The method then comprises a series of steps rendered possible thanks to the providing (S2) of the database under the form described above. These steps (S31, S32, S4) are performed for each respective (experience) object. For each object, the method instantiates (S31) triggering interfaces corresponding to the type of the object, and computes (S32) triggering zones by applying the function corresponding to the object. The method then adds (S4) to the scene the instantiated triggering interfaces and the computed triggering zones. Instantiation is known from object-oriented programming. Here, instantiating is opposed to computing because, in instantiation, the method only directs pointers to existing definitions. For example, with a door and a triggering interface which is a face of the door, the face of the door is already specified in the data defining the door. Instantiating the triggering interface merely means creating a new "triggering interface", of a certain class, associated to an action (opening the door in the example) and, link it, e.g. by means of pointers, to existing geometry (the face of the door in the example). The triggering interface may thus consist in a modified state of a part of the object for graphical interaction with a user (i.e. the part of the object is put in a state where user-interaction is possible, e.g. through a haptic device). The triggering interface may also consist in a displayed widget tool, such as phylactery, a button, or a drawing. Such widget tools are typically stored in the database and ready for instantiation. Instantiating the triggering interfaces instead of performing heavy computations speeds up the method.

The method thus allows the creation of a scene suitable for a refined navigation, by introducing actions and objects of different types. Notably, (one of) the action(s) of the first type may be different from the action (each of the actions) of the second type. This enhances the impression of reality experienced during navigation, because objects are provided with intrinsic actions. Preferably, the steps S31, S32, S4 are performed automatically. This is possible thanks to the database which specifies all data necessary for this automation. In such a case, the method is quick and very convenient. Indeed, the user does not need to worry about defining triggering interfaces, triggering zones, and actions. This is all performed automatically thanks to the database. Notably, when implemented in a CAD system, the system is suitable for management of CAD objects and may also be suitable for designing the objects and analyzing their behaviors, as discussed previously. In this case, the method is very convenient because the user only has to position objects and the rest of the design of the experience may be performed automatically.

Thus, the method may improve the whole manufacturing process by adding the possibility to navigate in a virtual world involving CAD modeled objects. For instance, prior to positioning the plurality of objects, the method may comprise designing a CAD model (or assembly) including the objects with a CAD system. Positioning the plurality of objects, providing the database, instantiating and adding to the scene the triggering interfaces, computing and adding to the scene the triggering zones may all performed with the same CAD system. Such a CAD system, which allows the classical design of CAD modeled objects, and the execution of the method, speeds up the overall manufacturing process and avoids manufacturing (for test) unwanted physical objects. The same CAD system may also provide for navigating in the scene designed according to the method, and thereby improve again the manufacturing of physical objects.

The navigation may follow different navigation modes. The navigation mode may be a $1^{st}$ person navigation, a $3^{rd}$ person navigation or a free camera navigation. In the first person navigation, the end user is not "physically" present in the scene with an avatar, but the viewpoint displayed by the software corresponds to the vision he would get if he was in the virtual scene. In the third person navigation, the end user is present in the scene through an avatar (a virtual human). In these two navigation modes, collision detection may be provided (it is not possible to go through a physical obstacle such as a wall). In the free camera navigation, the end user can navigate freely in the scene (fly off the ground, no collisions detection with the walls). A selection between these three modes may be provided for more ease of use.

Examples of different actions are now discussed.

The action may be any or a combination of displaying a point of interest, displaying and following a navigation path, displaying information on the object, reaching or displaying a path to the triggering zone of a sub-object, executing an intrinsic behavior of the object, and/or displaying information or parameters of the intrinsic behavior.

Again, non experience objects have no predefined actions and no predefined semantic. These objects are typically handled by the experience (i.e. during the navigation) only as 3D physical objects. Among experience objects, different categories may be defined according to the actions they allow.

A first category gathers objects interacting with the camera. This kind of objects may publish in the experience a point of interest (POI, i.e. a preferred position for the camera). This POI may be represented by a 3D widget that will be displayed only when the corresponding triggering interface is active. For example, for a window, the POI may be in front of the window to display the best viewpoint through this window. This kind of objects may also publish a navigation path (i.e. a series of position that the camera has to take). The start point of this navigation path may be represented by a 3D widget. Typically when the end user clicks on it, the control of the camera may be transferred to the object that takes the camera along the navigation path. This may be for example a navigation path to get up a stair: the triggering interface may be an arrow at the bottom of the stairs, and, when clicking on the arrow, the current camera is taken upstairs. Another example is a navigation path along a tube in a factory, or a plane.

Another category gathers objects displaying information on themselves. The action may for example consist in displaying a phylactery with some written information on the object, or launching an information message.

Another category gathers objects having intrinsic actions that can be launched, e.g. when clicking on the object, on a specific immersive GUI or 3D widget displayed by the object. In case actions can be launched by directly clicking on the object, the mouse cursor can get customized when moving over the object.

Another category gathers objects displaying information on their actions. In case the intrinsic action of the object publishes parameters on an implementation standpoint, it can choose to display some of them to the end user in the experience mode. This may be for example an init condition when running a specific action (target speed, initial state of the object).

It must also be noted that objects can contain other objects. Their inner volume may thereby delimit the triggering zone of other objects. The object can thus be in a way an experience zone itself and contain "sub-experience objects". Navigation parameters can be adapted within the zone. Activation of the (triggering interfaces of) experience objects inside the zone may depend on the zone and on position of the end user in the scene. For example, a house may contain stairs and windows, or an elevator can contain the third person avatar.

An example of how the triggering zones may be added to the scene is now discussed, in the case that an assembly designed in a CAD system is provided.

The assembly may have a data structure wherein the objects are hierarchically structured. The data underlying the navigation scene may similarly have a hierarchical structure. For example, all the computed triggering zones may be placed in an oriented graph wherein a child is (at least partly) contained in its parent. The triggering interfaces are end nodes. This renders the navigation easier in terms of CPU, as such a graph is easily readable.

For example, if the assembly is a building with the following tree structure:
Building
  Story 1
  Story 2
  Stair 1
  Openings
    Window 1
    Window 2
    Window 3
    Door 1
    Door 2

Then, the user typically positions (S1) the objects: the building, the windows and the doors. Then, the method recognizes the type of the experience objects positioned and, thanks to the database provided (S2), computes (S32) triggering zones. Typically, a triggering zone is computed for the building, called "building zone". This triggering zone may contain the triggering zones of the other objects. In this case, let us take the example where the triggering zone of each object is its story and each object has only one triggering interface corresponding to only one action, except for the stair which has two triggering zones for different actions with different triggering interfaces (the lower story for the action consisting in going up the stairs, and the upper story for the action consisting in going down the stairs, with an arrow in corresponding directions each time).

Figure 4:
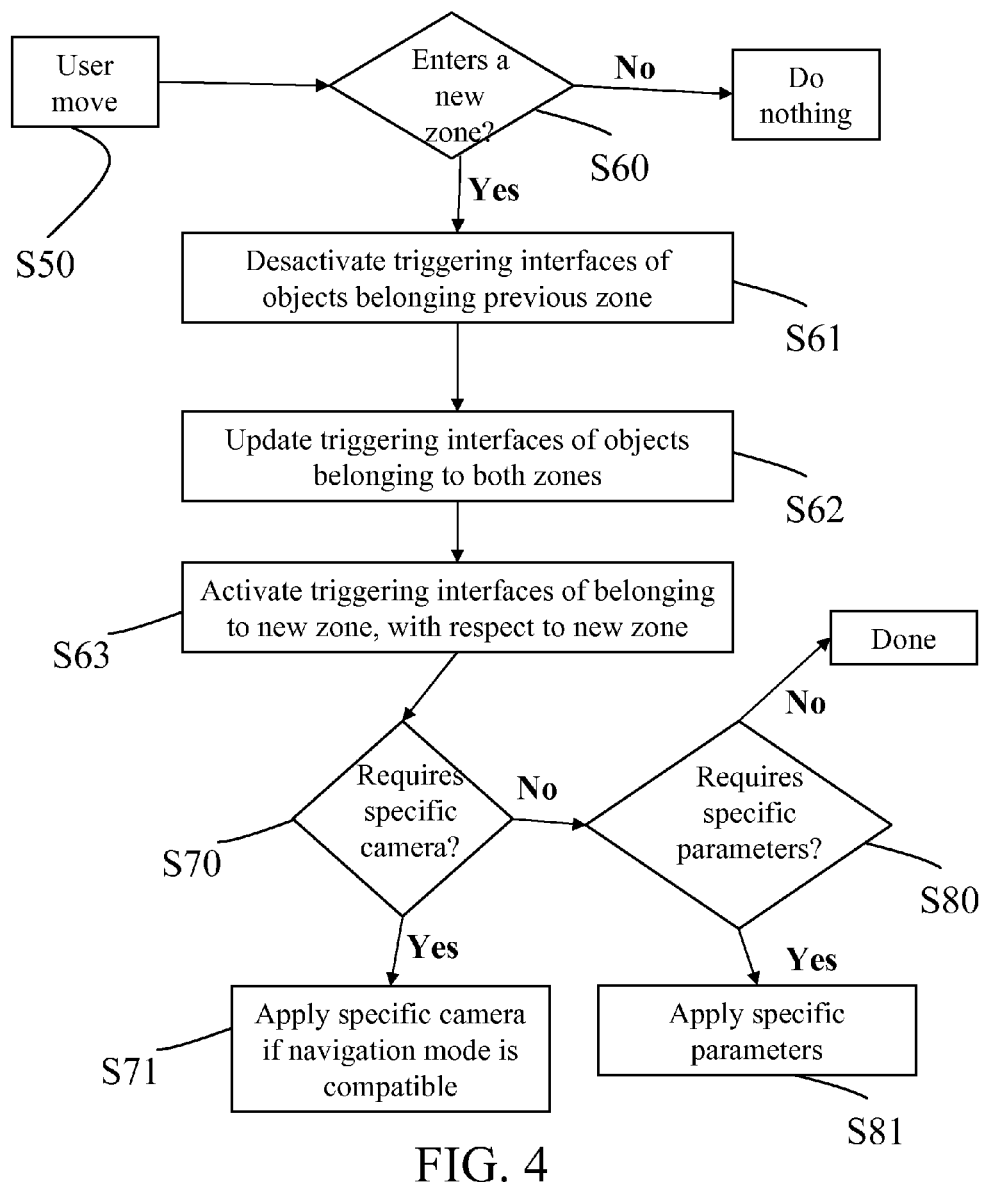
FIG. 4 shows a flowchart of an example of a navigation method.

The method may thus produce the following data structure:
Building zone
  Story 1 zone
    Stair 1 interface 1
    Window 1 interface
    Window 2 interface
    Door 1 interface
    Door 2 interface
  Story 2 zone
    Stair 1 interface 2
    Window 3 interface Now, an example for navigating in a scene designed according to the method is discussed with reference to the flowchart of FIG. 4. The flowchart represents a process executed dynamically in run-time during the navigation.

Substantially every time a user moves S50, the process tests S60 if the user enters a new zone. If the zone is the same, then nothing is done. If the zone is different, then the triggering interfaces associated to the new triggering zone are activated (S61-S63). Further tests (S70, S80) and further actions (S71, S81) may be performed for enhancing the experience.

Now, an example of designing a scene with the method and navigating in the scene is discussed with reference to FIGS. 5-12, which show screenshots of navigating in a scene 50 designed according to one implementation the method.

Figure 5:
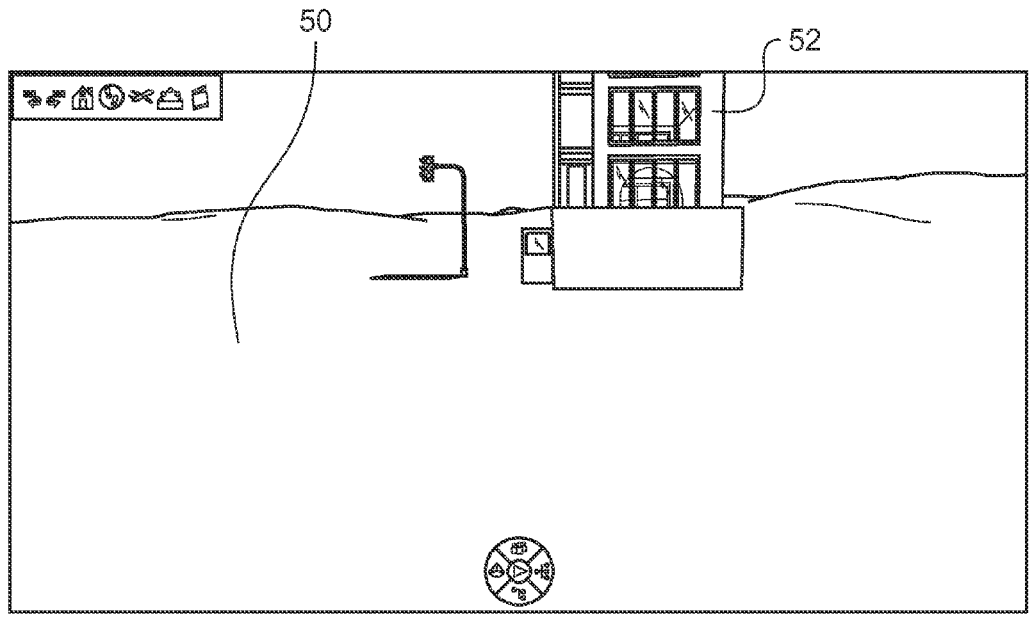
FIGS. 5-12 show screenshots of an example of a navigation method.
Figure 6:
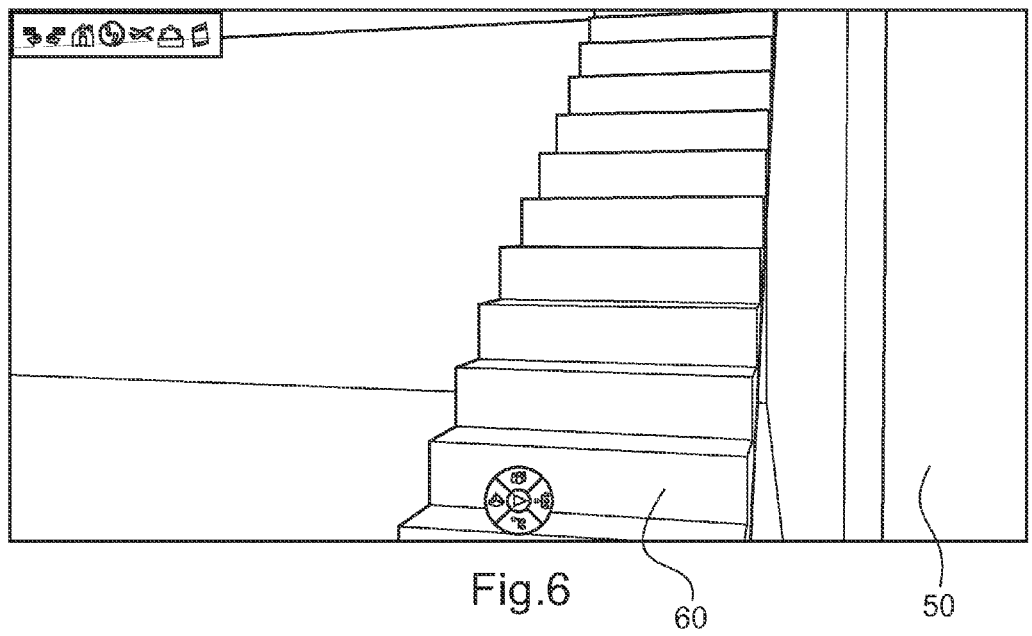
Figure 7:
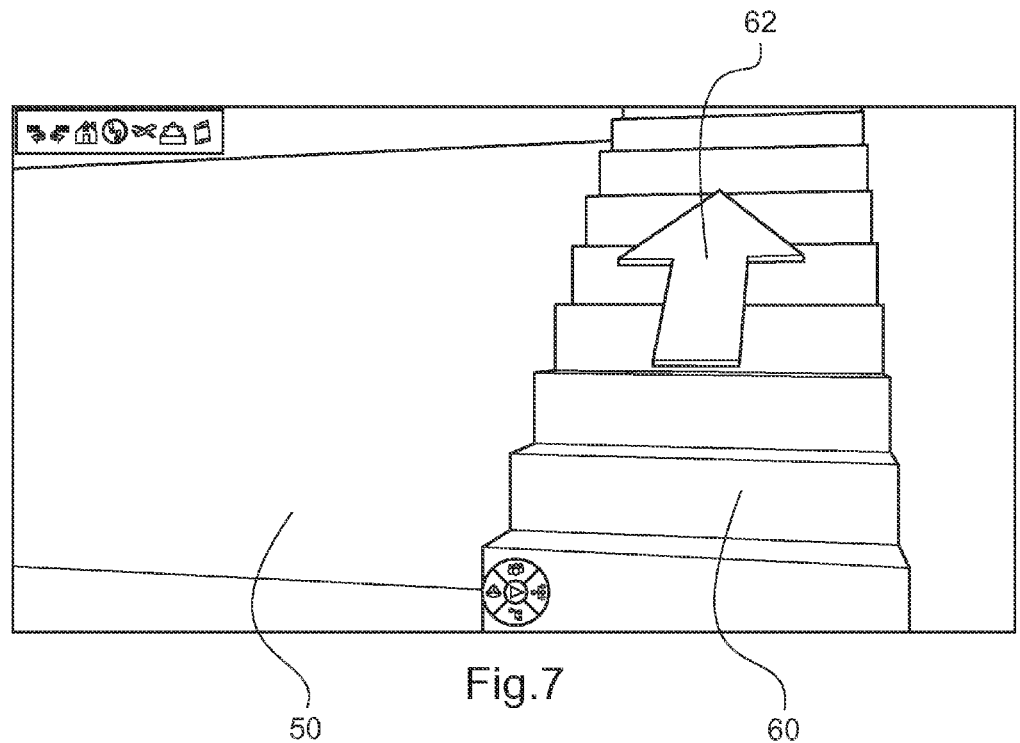
Figure 8:
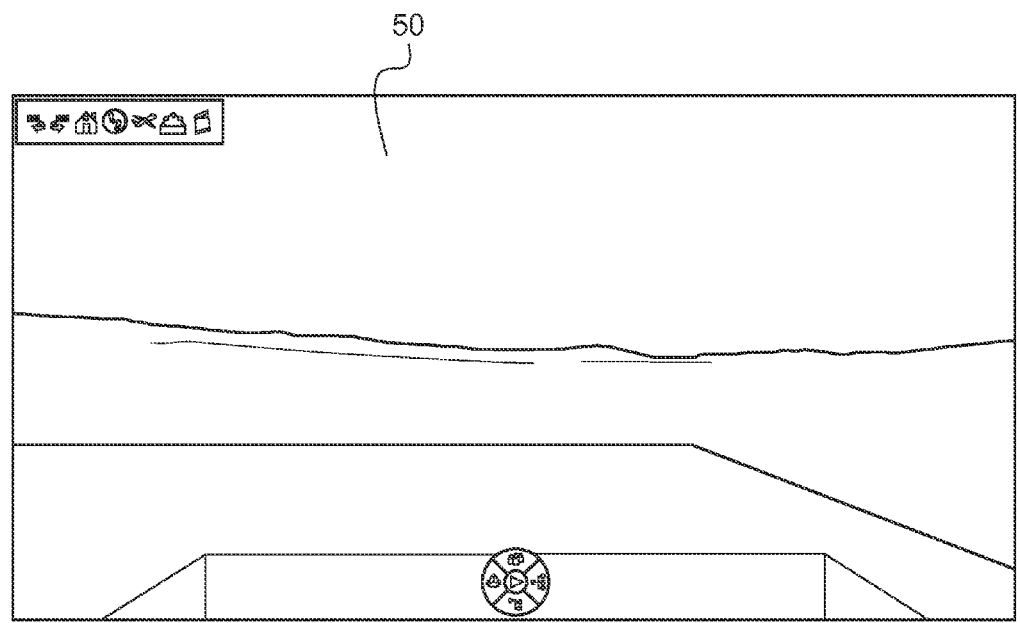
Figure 9:
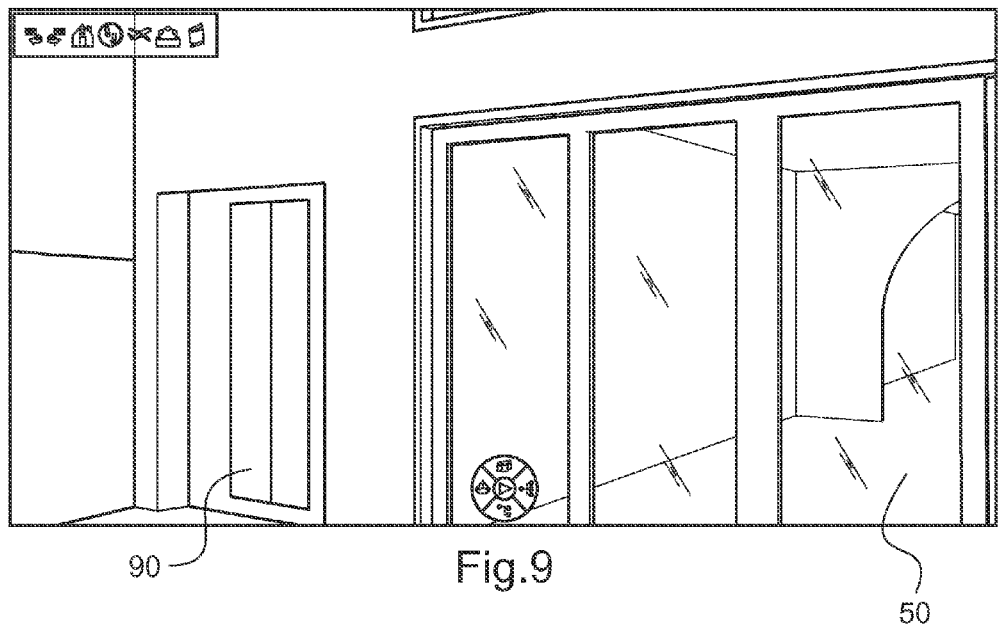
Figure 10:
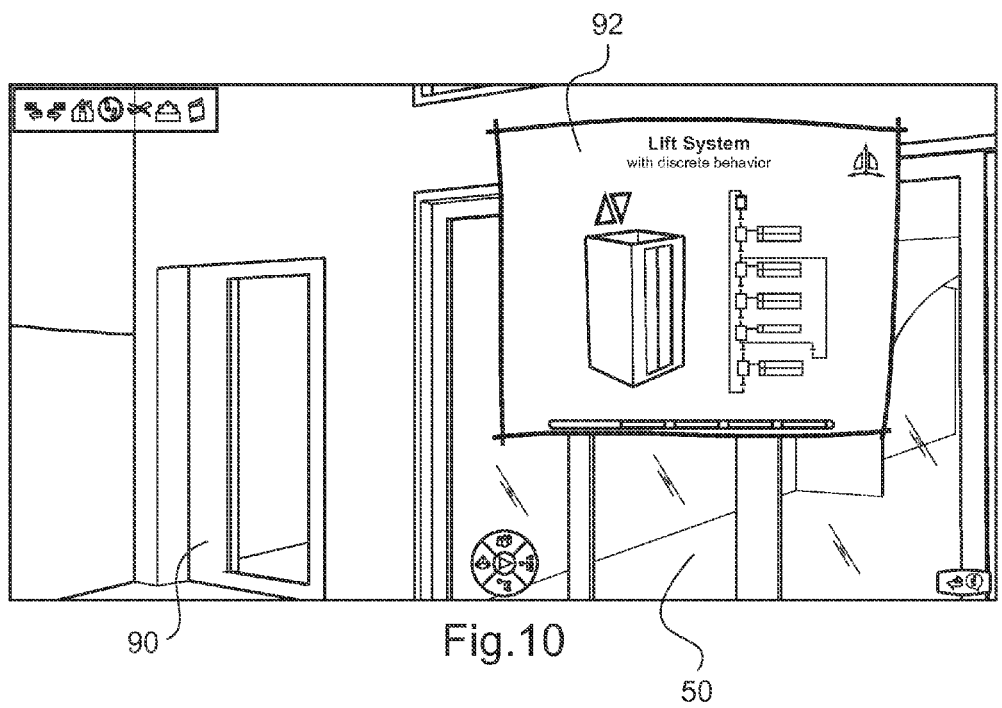
Figure 11:
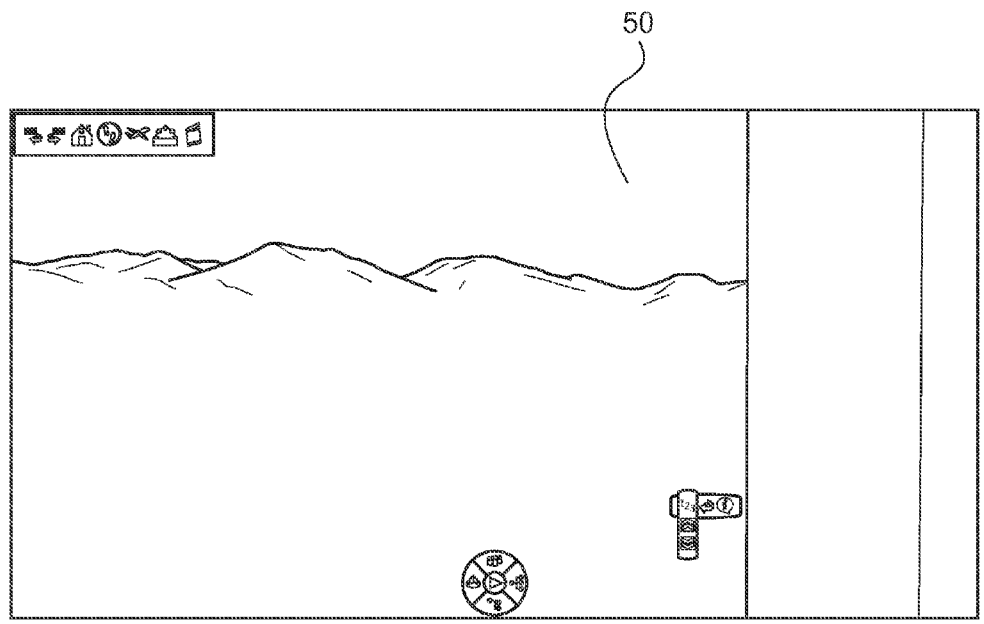
Figure 12:
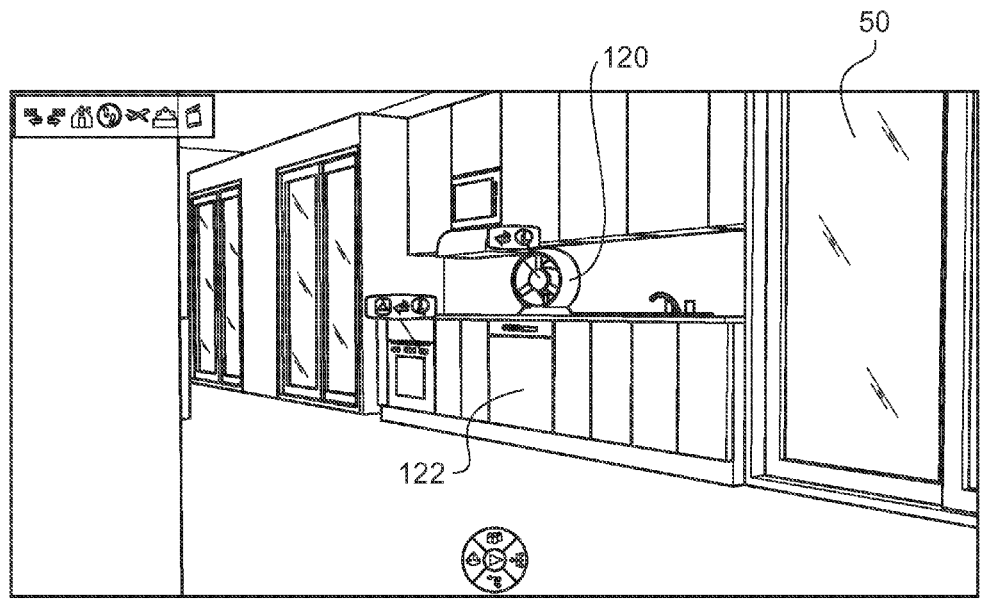

In this example, a structure which is the building 52 shown on FIG. 5 is positioned. This structure consists of non-experience objects (walls, ceiling, etc).

The method positions (S1) different objects. The positioned objects include a stair 60. The stair 60 has two actions as discussed in previous examples (take the camera up & down along a pathway) and a corresponding 3DWidget arrow 62 for launching these actions (according to the database which provides these information for the type "stair"). The positioned objects include an elevator 90, positioned at a certain point on the first floor. The elevator 90 has several actions with different interfaces (open/close doors by direct click, go up and down with the camera with immersive 2D GUI (phylactery) 92 to change floors). The positioned objects include a fan 120 positioned at a certain point on the fourth floor. The fan 120 has an action of turning its blades, launchable by clicking on the fan 120. It also has an immersive 2D GUI to reset the behavior or get information on the behavior. The positioned objects include a washing machine 122 positioned on the fourth floor under the fan 120. The drum of the washing machine 122 turns by direct click on its buttons. Here again, there is an immersive 2D GUI to reset the behavior or get information on the behavior.

The experience data structure may be the following:
Building Zone
  Ground Floor Zone
    Stair
  First Floor Zone
    Stair
    Elevator Zone
      (camera)
  Second Floor Zone
  Third Floor Zone
  Fourth Floor Zone
    Fan
    Washing Machine During navigation, when outside the building, no triggering interfaces are active, as shown on FIG. 5. When still outside the building but seeing the stairs, no 3DWidget visible, as shown on FIG. 6. When entering Building Ground floor, Stair 3D Widget 62 is visible, as shown on FIG. 7. Stair Experience Object is active (i.e. the action of going up is launchable). After clicking on the 3DWidget, first person Camera is taken to the first floor, as shown on FIG. 8. When getting in the first floor, the triggering interface of the elevator 90 is activated, as shown on FIGS. 9-10. A simple click on the doors open them, as shown on FIG. 10. When the first camera gets into the elevator 90, the elevator 90 receives an event and displays a new phylactery 92. Using it, the user can go to the second/third/fourth floor, as shown on FIG. 11. When getting on the fourth floor, the triggering interfaces of the fan 120 and the washing machine 122 become active and can be triggered. Their GUI becomes visible, as shown on FIG. 12. Elevator GUI is hidden when first person camera gets out of elevator zone.

The invention claimed is:

1. A computer-implemented method for designing a scene suitable for life-like navigation comprising of moving in a virtual world by a user, wherein the method comprises the steps of:

positioning a plurality of objects of a respective type in the scene, wherein the objects are CAD three-dimensional modeled objects of at least two types;
providing a database comprising for each type of object:
  at least one action,
  at least one triggering interface for launching the action,
  a function for computing at least one triggering zone as a volume of the scene, the function taking as arguments values of parameters of the objects in the scene, wherein reaching the triggering zone virtually by the user during navigation activates the triggering interface, the triggering zone being distinct from the triggering interface;
for each respective object in the scene:
  instantiating triggering interfaces corresponding to the type of the respective object, and computing triggering zones by applying the function corresponding to the respective object,
  adding to the scene the instantiated triggering interfaces and the computed triggering zones;
the positioningproviding, instantiating, and adding resulting in a designed scene, the designed scene being adapted for a life-like navigation experience that comprises a user navigating in the scene and includes:
  the user reaching the triggering zone of a respective object;
  detecting user positioning within the volume of the triggering zone;
  upon said detecting, activating the triggering interface of the respective object by loading the triggering interface in a buffer; and
  after said loading, launching the at least one action in response to the user performing a user-interaction with the triggering interface.

2. The method of claim 1, wherein the action of a first type is different from the action of a second type.

3. The method of claim 1, wherein the objects are defined by data suitable for the manufacturing of corresponding physical objects.

4. The method of claim 3, wherein the objects are defined by data comprising any or a combination of:
  dimension values,
  tolerance values,
  a history of geometrical features, and/or
  a set of behavior features.

5. The method of claim 1, wherein activating the triggering interface consists in displaying a widget tool or modifying the state of a part of the object for graphical interaction with a user.

6. The method of claim 1, wherein the action is any or a combination of the following:
  displaying a point of interest,
  displaying and following a navigation path,
  displaying information on the object,
  reaching or displaying a path to the triggering zone of a sub-object,
  executing an intrinsic behaviour of the object, and/or
  displaying information or parameters of an intrinsic behaviour.

7. The method of claim 1, wherein, prior to positioning the plurality of objects, the method comprises designing a model including the objects with a CAD system, and wherein positioning the plurality of objects, providing the database, instantiating and adding to the scene the triggering interfaces, computing and adding to the scene the triggering zones are all performed with the same CAD system.

8. A method for navigating in a scene designed according to the method of claim 1.

9. The method of claim 8, wherein a navigation mode is a $1^{st}$ person navigation, a $3^{rd}$ person navigation or a free camera navigation.

10. A CAD system comprising:
   a memory storing a database comprising:
      types of objects, wherein the objects are CAD three-dimensional modeled objects of at least two types,
      a plurality of objects of a respective type,
      for each type of object:
         at least one action,
         at least one triggering interface for launching the action,
         a function for computing at least one triggering zone, the function taking as arguments values of parameters of the objects in the scene, wherein reaching the triggering zone during navigation activates the triggering interface,
   a graphical user interface coupled with the memory and a processor and suitable for performing a computer-implemented method for designing a scene suitable for navigation, or for navigating in a scene designed according to the method for designing a scene, wherein the method for designing a scene comprises the steps of:
      positioning the plurality of objects of a respective type in the scene;
      for each respective object in the scene:
         instantiating triggering interfaces corresponding to the type of the respective object, and computing triggering zones by applying the function corresponding to the respective object,
         adding to the scene the instantiated triggering interfaces and the computed triggering zones:
      the positioning, providing, instantiating, and adding resulting in a designed scene, the designed scene being adapted for a life-life navigation experience that comprises a user navigating in the scene and includes:
         the user reaching the triggering zone of a respective object;
         detecting user positioning within the volume of the triggering zone;
         upon said detecting, activating the triggering interface of the respective object by loading the triggering interface in a buffer; and
         after said loading, launching the at least one action in response to the user performing a user interaction with the triggering interface.

11. A non-transitory computer readable storage medium having recorded thereon a computer program comprising instructions for execution by a computer, the instructions comprising means for performing a computer-implemented method for designing a scene suitable for navigation, or for navigating in a scene designed according to the method for designing a scene, with a graphical user interface of a CAD system coupled with a memory and a processor,
   wherein the memory stores a database comprising:
      types of objects, wherein the objects are CAD three-dimensional modeled objects of at least two types,
      a plurality of objects of a respective type,
      for each type of object in the scene:
         at least one action,
         at least one triggering interface for launching the action,
         a function for computing at least one triggering zone, the function taking as arguments values of parameters of the objects in the scene, wherein reaching the triggering zone during navigation activates the triggering interface,
   wherein the method for designing a scene comprises the steps of:
      positioning the plurality of objects of a respective type in the scene;
      or each respective object in the scene:
         instantiating triggering interfaces corresponding to the type of the respective object, and computing triggering zones by applying the function corresponding to the respective object,
         adding to the scene the instantiated triggering interfaces and the computed triggering zones:
      the positioning, providing, instantiating, and adding resulting in a designed scene, the designed scene being adapted for a life-like navigation experience that comprises a user navigating in the scene and includes:
         the user reaching the triggering zone of a respective object;
         detecting user positioning within the volume of the triggering zone;
         upon said detecting, activating the triggering interface of the respective object by loading the triggering interface in a buffer; and
         after said loading, launching the at least one action in response to the user performing a user-interaction with the triggering interface.

* * * * *

UNITED STATES PATENT AND TRADEMARK OFFICE
CERTIFICATE OF CORRECTION

PATENT NO. : 8,924,185 B2
APPLICATION NO. : 13/365887
DATED : December 30, 2014
INVENTOR(S) : Muriel Moreau and Adrien Cazaban It is certified that error appears in the above-identified patent and that said Letters Patent is hereby corrected as shown below:

In the Claims

In Column 12, Claim 1, line 22, delete "positioningproviding," and insert -- positioning, providing, --.

In Column 14, Claim 11, line 26, before "each", delete "or" and insert -- for --.

Signed and Sealed this
Twenty-first Day of April, 2015

Michelle K. Lee
*Director of the United States Patent and Trademark Office*